(12) United States Patent
Kohli

(10) Patent No.: US 7,143,341 B1
(45) Date of Patent: Nov. 28, 2006

(54) METHOD AND APPARATUS FOR CONCURRENT ENGINEERING AND DESIGN SYNCHRONIZATION OF MULTIPLE TOOLS

(75) Inventor: Vikas Kohli, Noida (IN)

(73) Assignee: Cadence Design Systems, San Jose, CA (US)

( * ) Notice: Subject to any disclaimer, the term of this patent is extended or adjusted under 35 U.S.C. 154(b) by 538 days.

(21) Appl. No.: 10/176,903

(22) Filed: Jun. 20, 2002

(51) Int. Cl.
*G06F 15/00* (2006.01)

(52) U.S. Cl. .................... 715/511; 715/517; 715/530

(58) Field of Classification Search ............ 715/511, 715/517, 530
See application file for complete search history.

(56) References Cited

U.S. PATENT DOCUMENTS

| | | | | |
|---|---|---|---|---|
| 6,240,429 B1 * | 5/2001 | Thornton et al. | ........... | 715/500 |
| 6,253,217 B1 * | 6/2001 | Dourish et al. | ............. | 715/500 |
| 6,308,179 B1 * | 10/2001 | Petersen et al. | ............ | 707/102 |
| 6,782,387 B1 * | 8/2004 | Kumashio | ..................... | 707/10 |
| 2004/0205540 A1 * | 10/2004 | Vulpe et al. | ................ | 715/511 |

* cited by examiner

*Primary Examiner*—Heather R. Herndon
*Assistant Examiner*—R. Singh
(74) *Attorney, Agent, or Firm*—John Carpenter; Reed Smith, LLP

(57) ABSTRACT

Concurrent engineering among multiple design groups is facilitated by maintaining design changes in a data model of a design being developed. Design changes for each group are made from a baseline design. Changes are tracked by maintaining change information from all but an owner of the original baseline design. Changes are synchronized by identifying owner and non-owner changes and merging the changes to produce a final design. Since non-owner changes are tracked, the baseline design is not needed in synchronization. Preferably the invention is applied to electronic designs made by multiple design groups at geographically diverse locations. The invention may also be applied to any system where configuration management of developed software, parts, or any design is needed.

27 Claims, 12 Drawing Sheets

METHOD AND APPARATUS FOR CONCURRENT ENGINEERING AND DESIGN SYNCHRONIZATION OF MULTIPLE TOOLS

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND OF THE INVENTION

1. Field of Invention

The present invention relates to design tools and coordination of engineering tasks between design tools. The invention is more particularly related to the coordination and synchronization of electronic design tasks between multiple tools and development activities.

2. Discussion of Background

As electronic design teams become geographically dispersed, there are changes in electronic design layout and logic that will inevitably occur concurrently. Even when designs are made in a single facility, concurrent changes are known to occur. Synchronizing these changes requires manual updates, which typically occur in a particular sequence of operations.

For example, FIG. 1 is a block diagram illustrating a process and information flow from design entry to layout and manufacturing of an electronic circuit using Cadence tools. The concept 110 first envisioned by a designer/user is input using the Concept™ schematic entry tool (Concept™ and ConceptHDL™ are design entry tools of Cadence for schematic capture) and the data is then input into a packager-XL™ 120. The packager-XL™ 120 is a Cadence tool for assigning physical packages to logic gates in the design. It creates the pst*.dat files all of which is forwarded to ALLEGRO® 130.

ALLEGRO® 130 is a High-speed PCB layout, routing, and manufacturing tool. ALLEGRO® is a family of solutions that enhance designer productivity during the placement and routing stages of PCB design. ALLEGRO® is the industry's first true physical and electrical constraint-driven system addressing performance criteria, as well as a wide range of design, testability, and manufacturing concerns. The more advanced Allegro Expert™ offers support for electrical and high-speed design rules managed through a revolutionary, spreadsheet-based Constraint Manager.

Other tools that may be used at this point in the design process include SPECCTRA®, which is the leading solution for intelligent, auto-interactive routing of PCB systems and complex IC packages. Designed to handle high-density printed circuit boards that require complex design rules, SPECCTRA® employs powerful, shape-based algorithms to make the most efficient use of the routing area. In addition, SPECCTRA® integration with ALLEGRO® layout, SPECCTRAQuest™ signal integrity, and APD provides high-speed constraint management across the entire design flow. Only SPECCTRA® offers a myriad of options to meet your specific design challenges.

ALLEGRO® 130 produces a *view.dat file 135, which along with the PST*.dat 125 file is used to determine differences in design via design differences tool 140. Design differences files, referred to as a marker file 145 is also produced and the design differences and marker file are forwarded to a design association tool 150 which then provides the information for modification of concept 110. The loop continues until a full design is complete and forwarded to a manufacturing process.

One of the problems in this architecture is that changes like connectivity changes have to be either done manually or using design differences and design association tools. There could be loss of data if the user forgets a step in the flow. And, although advanced tools and families of tools are available for PCB and IC design, the design process is more cumbersome than ideal, mainly because of designers working at different locations and changing different parts of the design (often at different stages of the design process).

SUMMARY OF THE INVENTION

The present inventor has realized the need for an integrated system that enables concurrent engineering between design entry and layout. The present invention includes a schema for connectivity that can be shared between the design entry and layout tools. It can also be used for generating HDL and analog net list. Included is a methodology on how each tool used by designers should update connectivity changes so as to make the process of design synchronization easier. The methodology assumes separate connectivity databases for design entry and layout tools. The present invention also includes facilities for outlines, or how a tool, like a schematic capture tool, can associate its graphics with the connectivity of a design. The present invention provides an architecture where the concurrent changes can be easily controlled and synchronized.

In one embodiment, the present invention is a method of concurrent engineering, comprising the steps of, establishing a baseline design, sending copies of the baseline design to different design groups, modifying at least one of the baseline designs sent to the design groups, and synchronizing the modified baseline designs to produce a single design.

In another embodiment, the invention is a device, comprising, means for synchronizing multiple designs having a common origin, wherein, each of said multiple designs comprises a design connectivity database storing design components and connectivity of a design and modifications made by a designer or front end tools (DESCONN), a layout connectivity database storing layout data and modifications of the design made by layout or backend tools (LAYCON), and the design connectivity and layout connectivity databases include occurrence sections to identify changes made from a baseline of the designs.

Preferably, the invention only tracks non-owner made changes, and owner made changes can then be deduced from evaluation of the non-owner design changes. And, the synchronization of the designs include display of all design changes to a lead engineer who selects the design changes for acceptance prior to synchronization. Selection of accepted changes may be done on a tool performing the synchronization or remotely (e.g., a web site powered by the synchronization tool, providing the lead engineer with a user interface to accept or reject design changes). Ultimately, the accepted design changes are synchronized and the process may then be repeated for subsequent design changes.

Portions of both the device and method may be conveniently implemented in programming on a general purpose computer, or networked computers, and the results may be displayed on an output device connected to any of the general purpose, networked computers, or transmitted to a remote device for output or display. In addition, any components of the present invention represented in a computer program, data sequences, and/or control signals may be embodied as an electronic signal broadcast (or transmitted) at any frequency in any medium including, but not limited to, wireless broadcasts, and transmissions over copper wire(s), fiber optic cable(s), and co-ax cable(s), etc.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
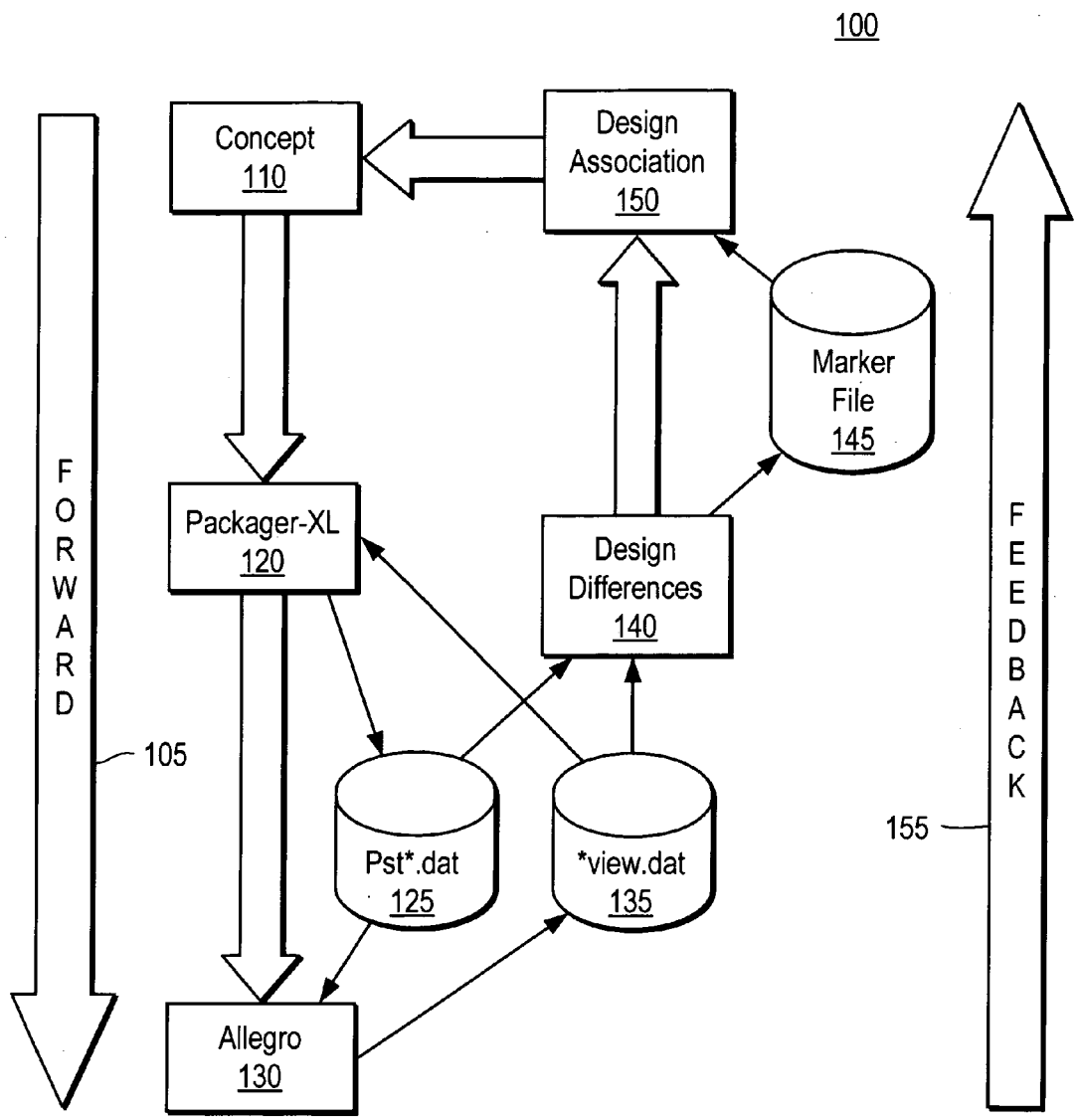
FIG. 1 is a block diagram illustrating a process and information flow from concept to layout and manufacturing of an electronic circuit.
Figure 2:
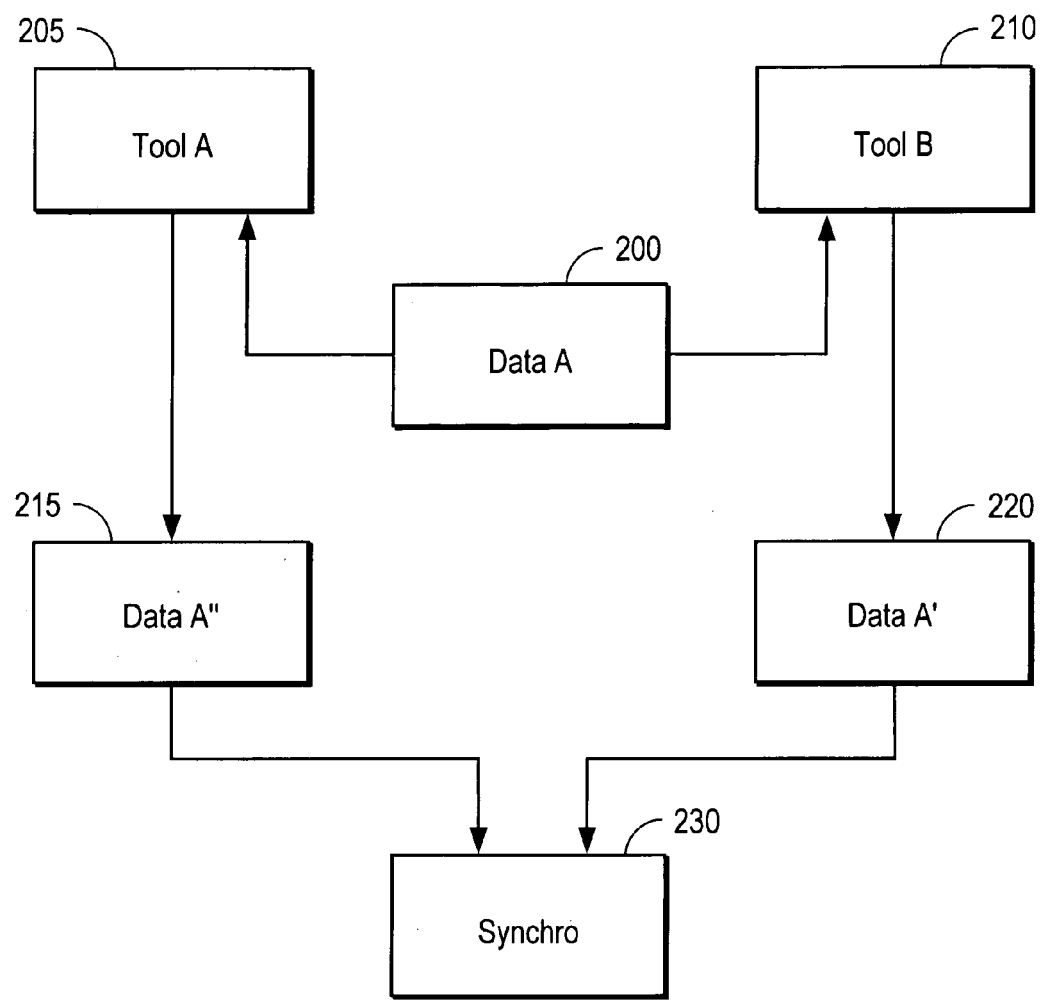
FIG. 2 is block diagram of data flow illustrating different tool operations performed by different designer/users on a common data set.

Referring again to the drawings, wherein like reference numerals designate identical or corresponding parts, and more particularly to FIG. 2 thereof, there is illustrated a block diagram of data flow illustrating different tool operations performed by different designer/users on a common data set. FIG. 2 represents one of many possible design iterations and modifications of design data. Design data 200 represents, for example, a first draft of a design produced by a first designer/user (e.g., user A). Data A is then used and modified by user A in Tool A 205. Tool A may be any design tool, such as a schematic capture tool, layout tool, any tool used to create or assign connectivity of the design, or may represent non-tool related modifications to Data A, resulting in a new data set Data A″ 215.

Data A 200 is also used by a separate design entity (e.g., user B), in a second tool, Tool B 210. Tool B 210 can be any design tool, such as a schematic capture tool, layout tool, any tool used to create or assign connectivity of the design, or may represent non-tool related modifications to Data A. Operations by Tool B 210 result in a new modified data set data A′ 220.

The new modified data sets A′ 220 and A″ 215 represent the common occurrence within modern design teams where different teams, often at geographically diverse locations, work with an initially common data set. At some point the data must be synchronized so that a single design is sent forward to the next level of design and/or production. A synchronization step 230 is provided to merge the designs Data A′ 220 and A″ 215. One problem that occurs with synchronization of different designs is that the synchronization tool must recognize whether differences from the two designs are due to elements being added to the original design (e.g., Data A 200), or if the differences are due to elements being deleted from the original design. For example consider a first modified design consisting of elements (V, W, X, and Y); and a second modified design consisting of elements (V, X, Y, and Z). The synchronization of the designs is helpful if it is known whether element W was added to the first modified design, or if element W was removed from the second modified design. Previous tools maintain a copy of Data A 200 to determine what elements were added and which elements were deleted from the original design. However, the previous tools are required to store and read from both of the new modified designs and from the stored original design (Data A 200) in order to perform that task.

Synchronization tool 230, however, uses the present invention that does not require maintenance of the original design to perform synchronization. The present invention includes a data model that stores all of the elements of the current design, along with facilities for identifying what changes to the previous model were made, and who (which designer/user) made those changes.

In one embodiment, the data model includes annotations in a section of the data model separate from the design that indicates any changes made by designer/users that are not the owner of the data model. For example, in FIG. 2, user A created the original design Data A 200. User B modified the original design, and in so doing created Data A′ 220. Data A′ 200 includes identifying material that indicates user B made changes and identifies exactly what changes user B made.

For example, consider a case where the original design Data A 200 consists of elements (V, X, and Y), Data A′ 220 consists of elements (V, W, X, and Y), and Data A″ 215 consists of (V, X, Y, and Z). Data A′ was produced by User B modifying Data A 200, and Data A″ 215 was produced by User A modifying Data A 200. Since user A was the original creator (owner) of the original data set (Data A 200), no annotations are made to user A's modifications. However, User B is modifying a design that s/he does not own, and Data A′ 220 therefore includes annotations that indicate the modifications made by user B. In this example, those annotations show that user B added element W. Therefore, the synchronization tool 230 only needs to read Data A″ and Data A′ to know that user B added element W, and, by deduction, then also know that user A's modification were to add element Z (e.g., since element Z was a difference between A′ and A″, and A′ (user B) had no annotations indicating modifications removing element Z). All design modifications can be deduced by keeping track of modification made by all users except a designated baseline user. Preferably, the designated baseline user is the owner or original creator of the design (e.g., Data A 200). However, other embodiments may assign the baseline user to other than the original owner/creator of the design.

The process may also be extended to more than the two users indicated in FIG. 2. Ultimately, many different users from different design teams using different tools may be supported by the present invention. Multiple users and design tools occur frequently in present day electronic designs. Each designer/user, if not the designated baseline user, has all of their modifications annotated in a separate section of the data model. Preferably, the annotations describe user modifications and are kept in a separate portion of the data model. In another embodiment, the annotations are stored in files separate from the data model. In the latter embodiment, the synchronization tool 230 needs to have access to the separate files.

Figure 3:
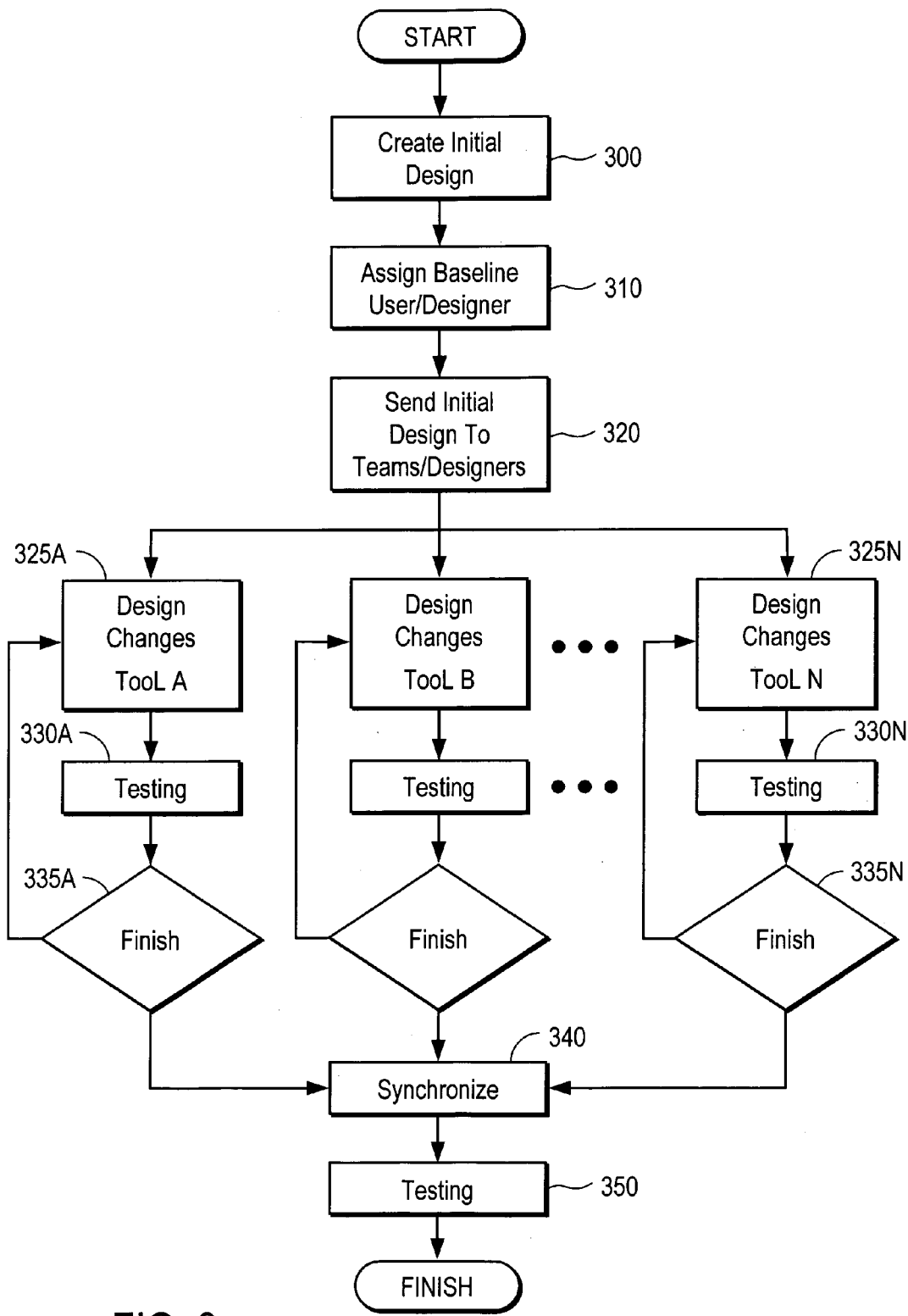
FIG. 3 is a flow chart illustrating a high level flow of a design process according to an embodiment of the present invention.

FIG. 3 is a flow chart illustrating a high level flow of a design process according to an embodiment of the present invention. At step 300, an initial design is created. A baseline user is designated at step 310. Again, preferably a user that created the initial design is the designated baseline user. At step 320, the initial design is sent to various teams and/or users. The flow now branches out into a number of arms, each arm representing a different design team or user. Each arm includes the steps 325, 330 and 335 which comprise design changes, testing, and an iteration for additional changes and testing until a finished product is produced by each of the teams/users. At step 340, the designs from each of the design teams/users is synchronized.

The synchronization process 340 includes merging the design changes from the various design teams/users and, a review and acceptance or rejection of each design change. The accepted changes are then tested (step 350).

Figure 4:
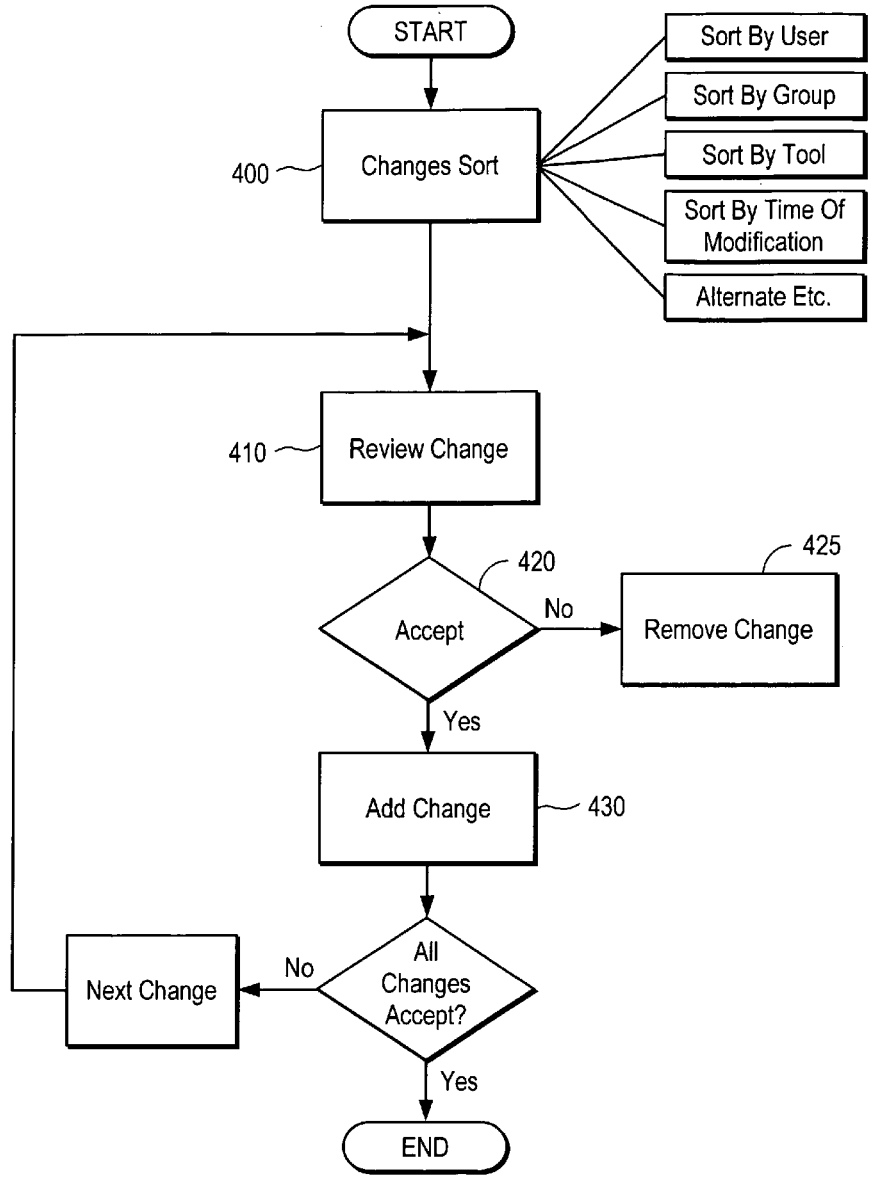
FIG. 4 is a flow chart of design change acceptance and rejection according to an embodiment of a synchronization process of the present invention.

FIG. 4 is a flow chart of design change acceptance and rejection according to an embodiment of a synchronization process of the present invention. At step 400, the changes from the various design teams/users are sorted. Preferably, the changes are sorted by design tool. Generally speaking, or individual users will work with a single tool, such as SPECCTRA® or ALLEGRO®. There may be several users using the same tool in a design team. The changes may be sorted in any particular way, or not sorted at all. Alternative sorting techniques include sort by user, sort by group, sort by time of modification, and/or sort by type of modification. The changes are then reviewed either individually, by group, by tool or other change category. With each change accepted, the process proceeds to step 430 where the accepted design change is added to (merged with) the design. Preferably, design changes are stored separately from the design until they are merged after acceptance. However, alternative methods such as merging all changes and then removing them may be utilized. If the design change is not accepted, the process proceeds to step 425 where the change is removed from consideration for the design Alternatively, design changes are added to the design and then removed if rejected. If all changes have been either accepted or rejected, the process completes or repeats until all the changes have been reviewed and either accepted, rejected, or the designer exits the design change synchronization process. In one embodiment, rejected changes are stored in a rejected state within the design. This helps synchronization when, for example, user B (say the integrator) pushes a design in which he has rejected some of the changes done by user A. User A can then determine that some of the changes have been rejected by user B. Determining changes can be accomplished by, for example, selecting a menu option to display accepted/rejected changes, or, the design tool may be programmed to automatically display rejected and/or accepted changes when a user first reviews a changed or updated design. One user A has seen the rejects they are removed from the design. The next time user A sends his design changes to user B, first the rejects in user B's design would be cleaned and then the synchronization would occur. In one embodiment, a reject status of changes is removed from the design when user B takes a latest design shot from user A. User A can then determine that some of the changes have been rejected by him. Determining changes can be accomplished by, for example, selecting a menu option to display accepted/ rejected changes, or, the design tool may be programmed to automatically display rejected and/or accepted changes when a user first reviews a changed or updated design. In one embodiment, a reject status of changes is removed from the design when user B takes a latest design shot from user A.

Figure 5:
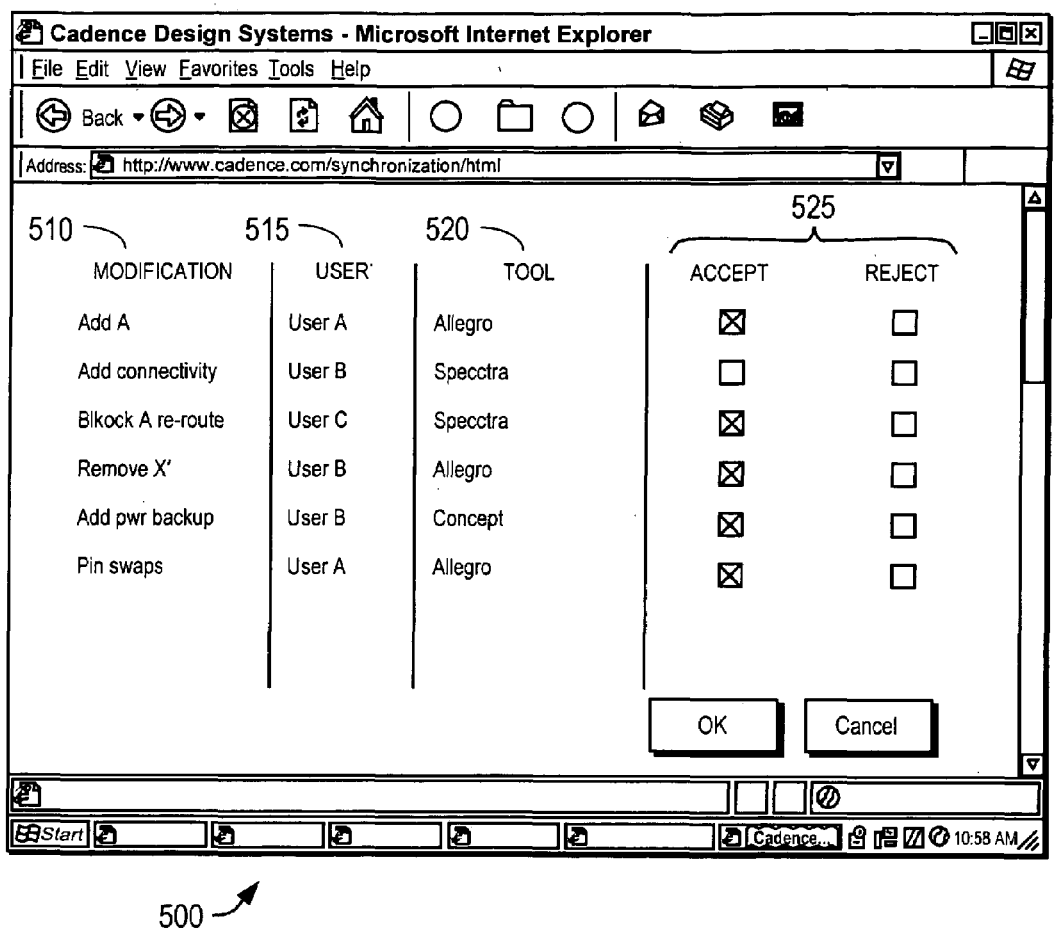
FIG. 5 is an example of a user interface of a design change accept/reject process according to an embodiment of the present invention.

FIG. 5 is an example of a user interface 500 of a design change accept/reject process according to an embodiment of the present invention. In FIG. 5, the user interface displays each of modifications made by the various design teams/ users. The modification is identified by a short description 510, and corresponding parameters such as user name 515 and tool 520. Selection boxes 525 are provided for accepting or rejecting the design changes. In one embodiment, the short description is a link to further information to help make a decision on whether or not to accept or reject the design change, and clicking on a short description of a design change brings up a detailed view that explains the design change more thoroughly. For example, the detailed view may include a written description of the design change, and include links to schematics or other information supporting that design change. A chief designer reviews each of the modifications and checks either "accept" or "reject" for each change and then clicks "OK". A design change/modification process then takes the information from the user interface and automatically accepts or rejects each of the changes and merges the accepted changes into the design.

Figure 6:
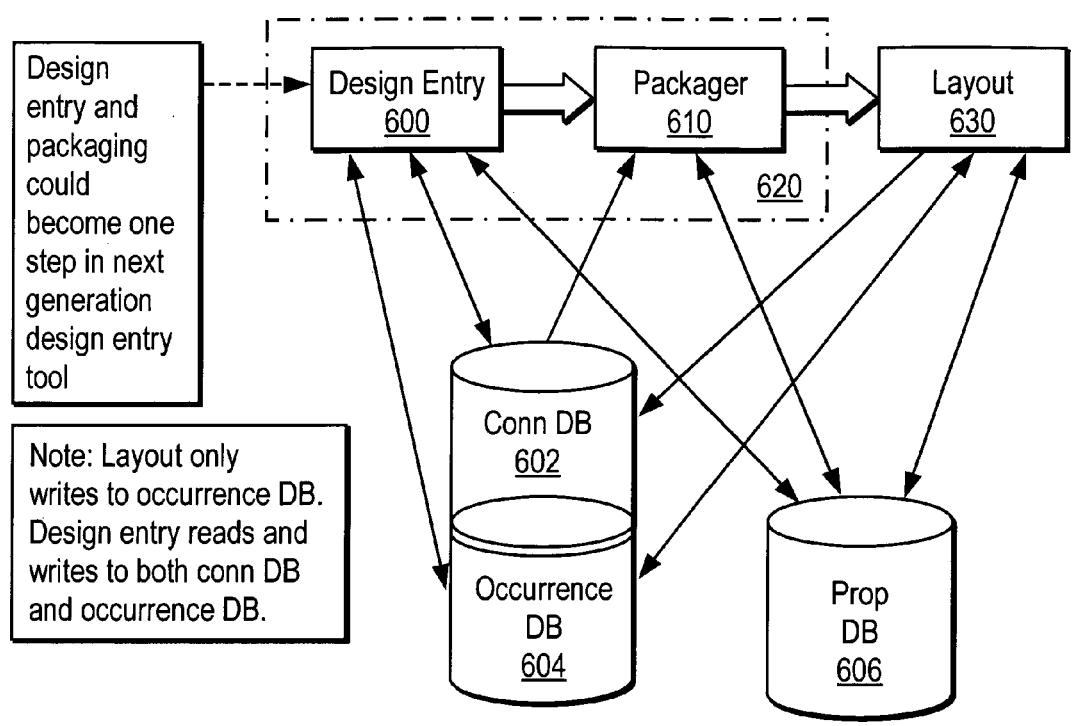
FIG. 6 is an example flow according to an embodiment of the present invention.

Turning now to a more detailed view of the various processes of the present invention, FIG. 6 is an example flow according to an embodiment of the present invention. FIG. 6 shows a design entry tool 600 that reads and writes design entry data to connectivity DB 602, Occurrence DB 604, and Property DB 606. Each of the databases are sections of the design model. The database data produced from the design entry tool 600 are forwarded to a packager 610. However, packaging will likely merge into design entry in future design entry solutions. Therefore, both the design entry tool 600 and packager 610 are illustrated within the confines of a next gen tool box 620. A next generation tool box 620 represents a tool that combines both design entry and packaging into a single tool (e.g., tools to be developed or existing tools that package during design entry). Outputs from the packager 610 are forwarded to a layout tool 630 (e.g., SPECCTRA®, ALLEGRO®). The process merges the pst*.dat files and *view.dat files into a new connectivity format and property database format. Layout writes changes into an occurrence section, as the data originated from design entry, and design entry writes to occurrence section in special cases. Then the problem of design synchronization can be simplified. The idea is that tools do not remove the entry of an object created by another tool from the netlist. Instead, they move it from one section to another.

The architecture keeps the connectivity schema and properties as separate entities. Also, each tool is assigned a unique prefix. This prefix is used for creating ids of new objects added by the tool. Once an id has been used in a module it is not reused in order to avoid any potential confusion.

Changes done in design entry are written to the connectivity section. Only in the case of deletion/modification of an object, which was added in layout should design entry write to occurrence section. Changes done in layout are always written to the occurrence section.

Figure 7:
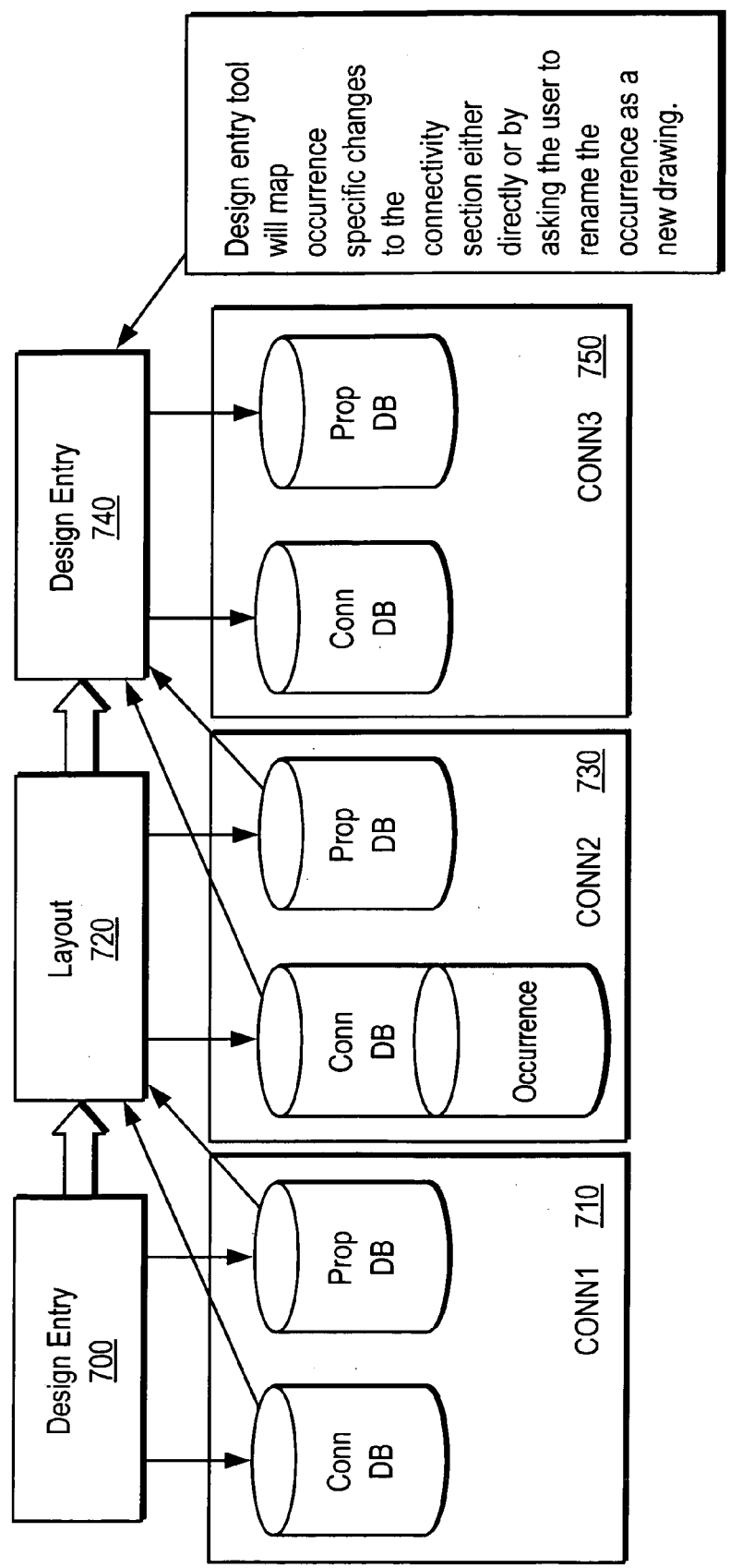
FIG. 7 is an example flow of back end design changes according to an embodiment of the present invention.

Consider the following scenarios in design synchronization (FIGS. 7–10):

FIG. 7 is an example flow of back end design changes according to an embodiment of the present invention. An initial connectivity list CONN1 710 is created by design entry tool 700. Layout tool 720 then creates a new connectivity list CONN2 730. Since the changes are made only in layout they will either be in occurrence section of connectivity or in the property section When CONN2 730 is opened using the design entry system 740, the system will verify whether these are changes inside a block that is reused multiple times. If yes then the user will be asked to do these changes inside a new block which is a copy of the reused block. If the block is not used multiple times, the change can be annotated onto the block itself.

In one embodiment, if the block is reused on multiple occasions and only one occurrence is modified in layout, the design entry tool 740 will update a drawing of the design and ask the user to save the updated drawing as a new drawing 750 750. Once the user saves the new drawing, a corresponding symbol instantiation in the design hierarchy will be updated to reflect the new cell name (the cell-id is updated and the instance id remains unchanged). The ids within the newly named drawing will be preserved. Therefore, the next time connectivity is pushed to the back end, even though the design name may have changes, the connectivity/ids are not changed.

Figure 8:
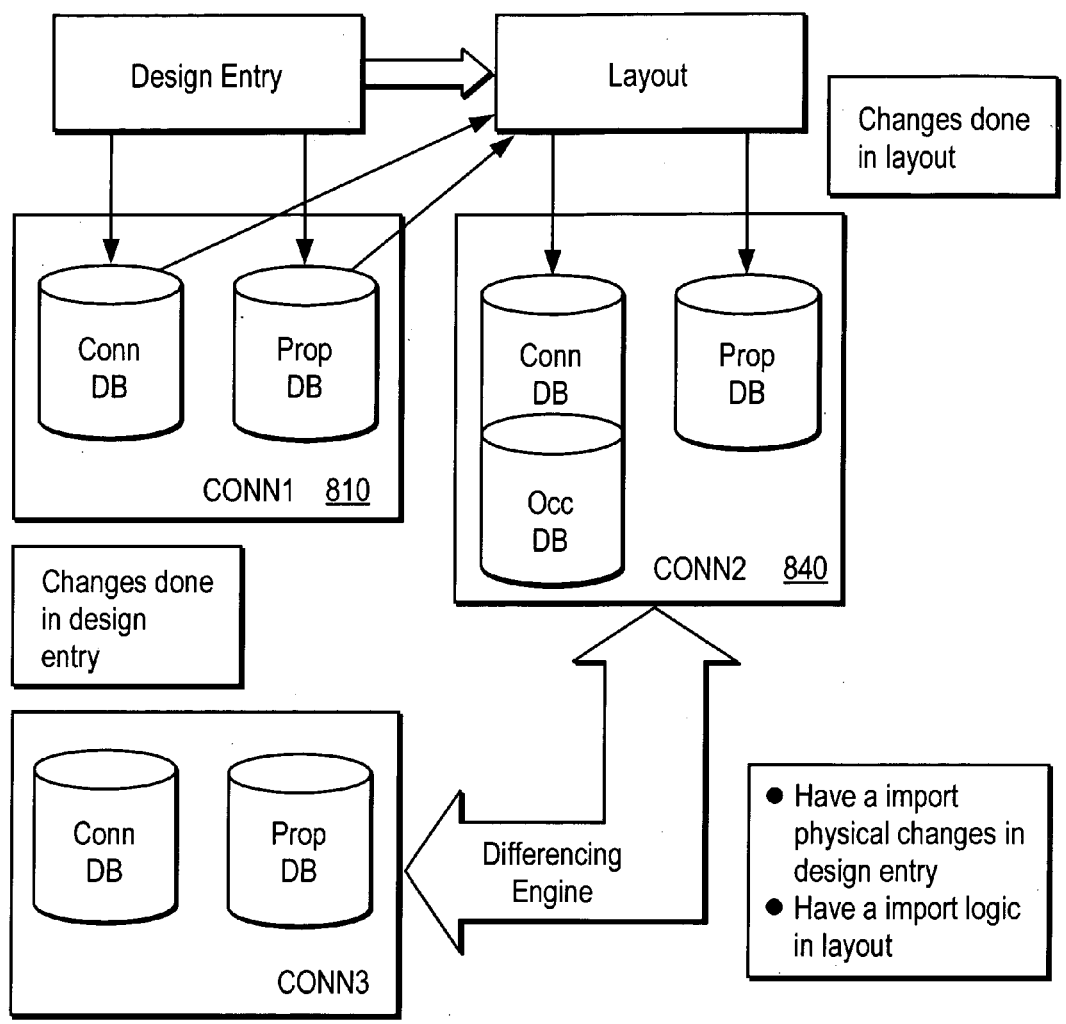
FIG. 8 is an example flow of front end and back end design changes according to an embodiment of the present invention.

FIG. 8 is an example flow of front end and back end design changes according to an embodiment of the present invention. In these cases, the logic engineer enters his/her design in connectivity CONN1 810 and exports it for layout to connectivity CONN2 840. Then, the logic engineer continues making changes to the connectivity CONN1 810. The changes made by layout engineers are updated in an occurrence section (Occ DB) of CONN2 840.

Figure 9:
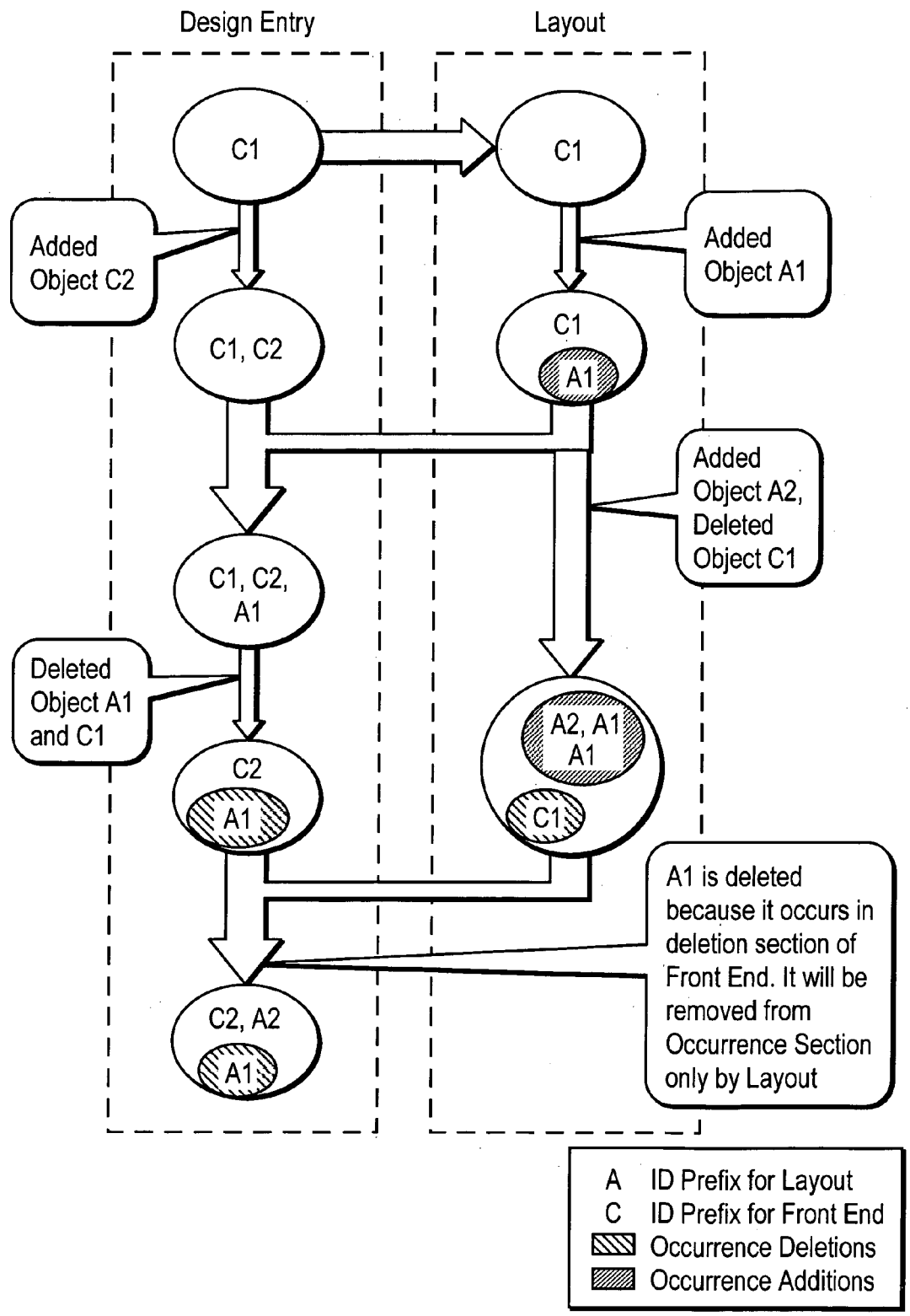
FIG. 9 is an example flow of merging front end changes according to an embodiment of the present invention.
Figure 10:
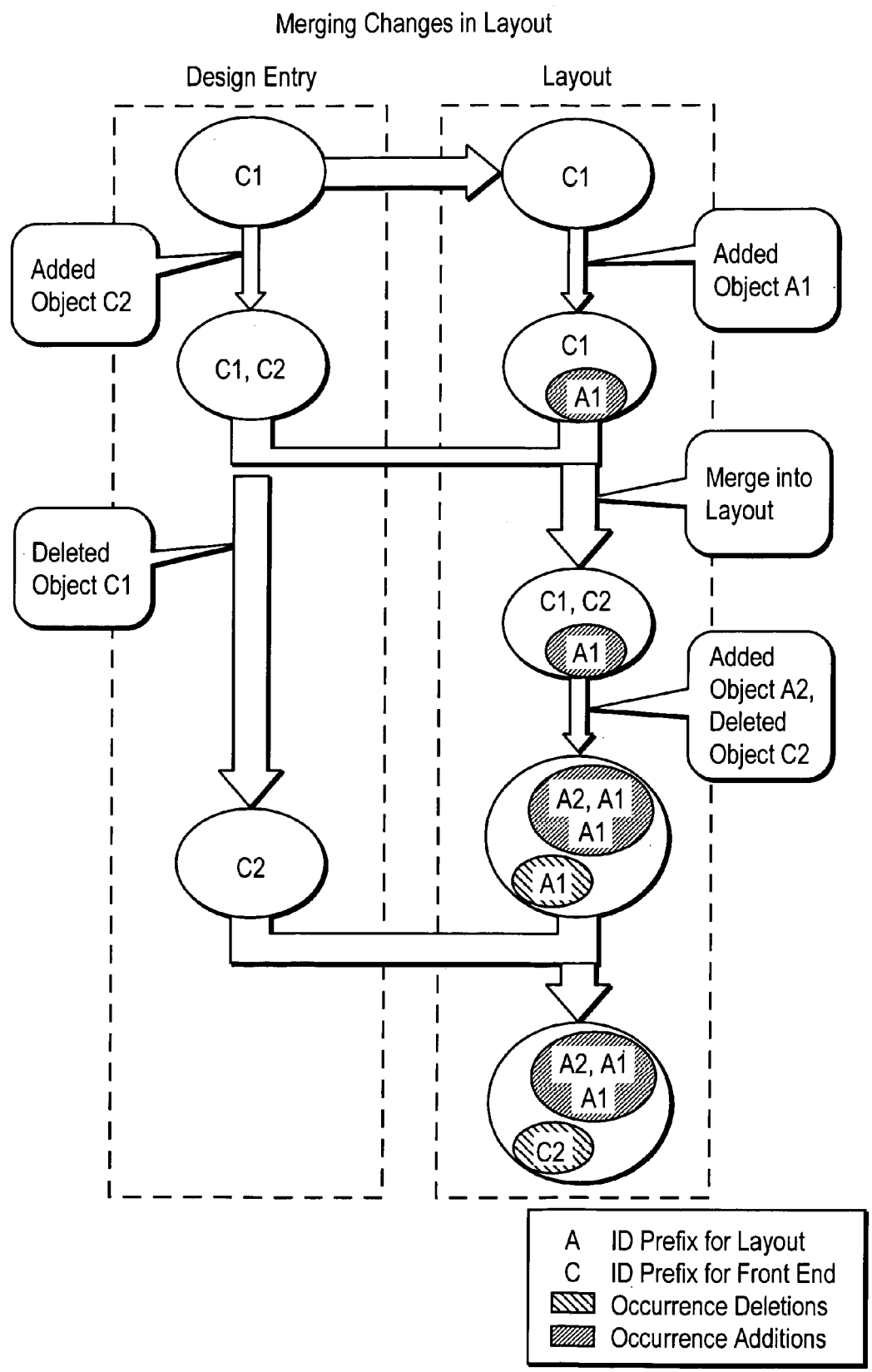
FIG. 10 is an example flow of merging layout changes according to an embodiment of the present invention.

FIGS. 9 and 10 illustrate how synchronization merges the new changes. FIG. 9 is an example flow of merging front end changes according to an embodiment of the present invention, and FIG. 10 is an example flow of merging layout changes according to an embodiment of the present invention.

Design synchronization can then be performed using a process that follows the set of object/inference rules illustrated in Table 1. DESCONN is an identifier for connectivity from design entry and LAYCONN is an identifier for connectivity from layout.

TABLE 1

| Object | Inference |
| --- | --- |
| New Id in DESCONN, not present in LAYCONN | New object added in front end |
| Front end created Id in LAYCONN & not in DESCONN | Deleted object in front end |
| Front end Id in LAYCONN & DESCONN but also in occurrence delete in LAYCONN | Deleted in layout |
| Layout Id in occurrence add section in LAYCONN | New object in layout |
| Layout id in occurrence delete section of DESCONN and occurrence add section of LAYCONN | Id was added in layout and has been deleted in front end. |
| Same instance id but different cell id in DESCONN | User has used modify/replace in front end |
| New pin net conn id in LAYCONN, a pin net conn id in occurrence section in LAYCONN, new pin net conn-id in DESCONN for same pin. | There has been a simultaneous change of connectivity to a pin in front end and back end. |

A new id is created for any of a new cell, instance, new instance terminals (or pins) of the new component, and new nets.

Front End Changes

In the case of changes made only in the front end, the initial connectivity list is CONN1. The new connectivity list from the front end is CONN2. The layout tool imports the new connectivity inside an existing board, and detects that the ids are no longer valid, and determines the new ids and changes in pin net connections. Based on the type of changes, the layout tool takes necessary action to modify the layout.

Changes can be additions of an instance or pin-net connections. The layout tool determines the differences and the user accepts or rejects them.

Synchronization of Concurrent Changes in Front End

Page Level for Schematic Capture

The present invention also performs page level schematic capture. In one embodiment, page level schematic capture is performed via an import feature. For example, consider the case where User A is assigned to work on pages 1–10 of module foo, and User B is supposed to work on pages 11–20. User B creates his design as fool. After finishing this can be imported in foo as pages 11–20. The import is performed as follows:

For common signals the net id in fool will be updated. For signals that are unique in fool id would be updated if it conflicts with an existing id in foo.

Some modification of the process will be necessary if the design entry tool does packaging on the fly. In one embodiment, to keep track of subsequent sections, a section for id aliases is utilized (this is different from alias section in schema, the one in schema is for nets). The ids of fool are kept as an alias id for their corresponding new id in foo. Attributes are merged in the property DB. Property conflicts, like same property but different values on same net name in foo and fool, are highlighted to the integrator (user) and s/he resolves them.

Figure 11:
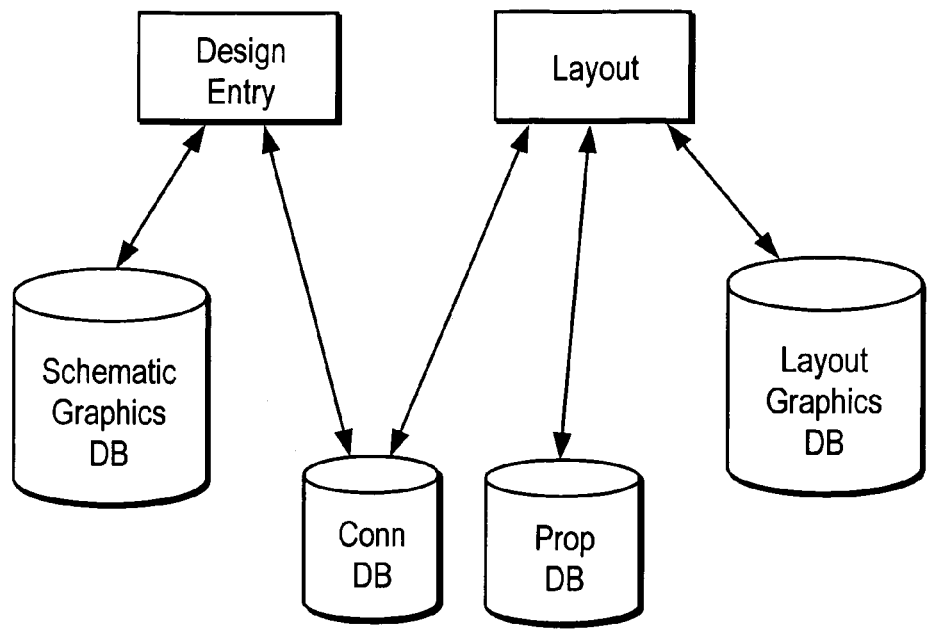
FIG. 11 is an illustration of database layout and data flow according to an embodiment of the present invention.

FIG. 11 is an illustration of database layout and data flow according to an embodiment of the present invention. Tool specific information (e.g., graphics of a schematic page) are kept in a different database from the connectivity database. The property database is also independent of the connectivity and graphic database. For example, a graphic database would have an entry WIRE <wireid> (x1,y1) (x2, y2) netid where netid is the id of the net in the connectivity database. The property database would have an owner id for a property. The owner id then maps to an object in the connectivity schema.

The schematic entry tool, on opening the design, resolves these netids so that it can show the net name when user does attributes on the net. Similarly, properties which have been made visible in a schematic entry tool would have placeholders in the graphic database. The placeholders have a value field updated by the schematic entry tool.

Schema for Connectivity

Each tool is given a prefix, which will be appended to the id of any objects generated by the tool. This id is not changed, and is used as the database key in all the databases. The present invention includes version and tool name information stored to identify the source of the schema. If a user creates the connectivity in the front end and takes it to the back end, then the creator tool name is the front end (e.g., Concept). In the back end, if the user changes some connectivity, then the version is incremented and the last tool is updated to the back end's tool name. Id's created by changes in the design entry tool will have a unique prefix (e.g. Concept 'C' and ALLEGRO® 'A').

Figure 12:
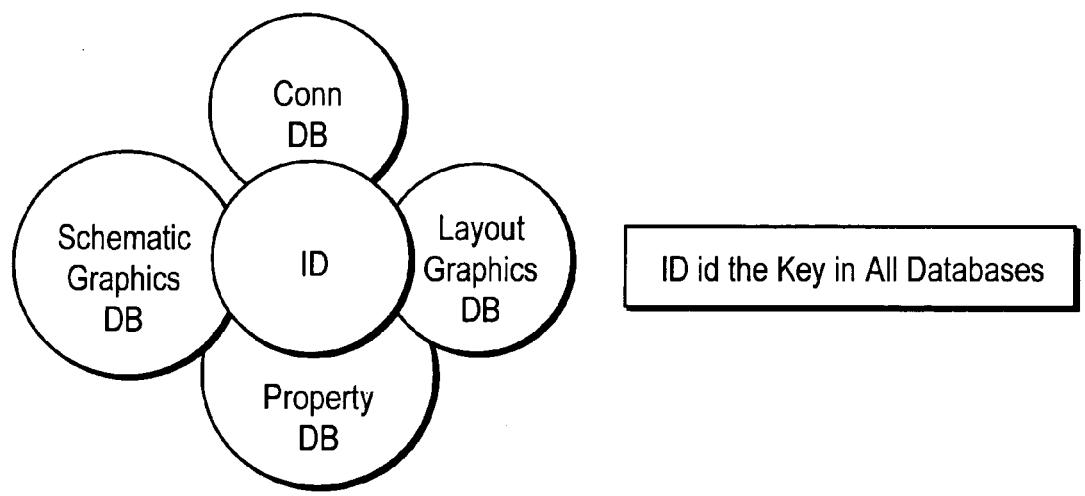
FIG. 12 is a graphical representation of a database key according to an embodiment of the present invention.
Figure 13:
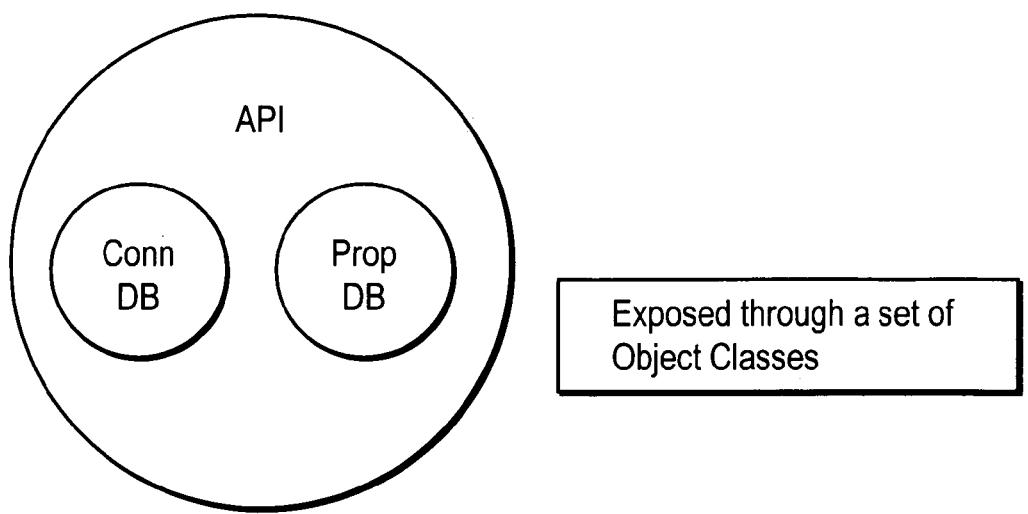
FIG. 13 is a graphical representation of an API according to the present invention.

Preferably, the connectivity is a set of files based on levels of hierarchy. In one embodiment, an option is provided for collapsing all these into a single file (i.e., add a design section in the schema and there can be multiple designs in a file, a root design being the first design in the file). The files are stored individually or collectively in a database or in XML. FIG. 12 is a graphical representation of a database key according to an embodiment of the present invention. Each of the databases are keyed to an ID. FIG. 13 is a graphical representation of an API according to the present invention. A set of object classes makes the connectivity (Conn) and Property (Prop) databases accessible to the applications.

Table 2 recommends a schema for storing connectivity information. Italics represent variables. The parameters are listed in a psuedo code type listing. As with all the example programming structures presented herein, Table 1 is not intended and a compilable or exectutable portion of code, but as an example programming or other structure that reflects a non-limiting implementation of a process or method consistent with the present invention.

TABLE 2

```
(version no)   /* version of file updated for every change */
  ((tool
    (creator name)   /* name of the tool that created the file
*/
    (last name))   /* name of the tool that last wrote to
                   /* the file */
  (design name  /* name of design */
    ((params    /* design parameters */
      (name value))
    (cells      /* list of cells used in the design */
      (cell-id <name> <lib> version
        (params    /* parameters of a cell */
          (name value))
        (terms     /* terminals of the cell, equation for
                   /* sizeable */
          (term-id name startindex endindex direction) OR
          (term-id name equation direction))
      /* direction means input/output/inout */
      )  /* end cells */
    (nets
      (net-id name startindex endindex
global/interface/local)
      )  /* end nets */
    (aliases
      (net-id1 startindex endindex net-id2 startindex
endindex)
      )
    (instances
      (inst-id cell-id
        (params
          (name value))  /* created only if the value is
                         /* different from Default value */
```

TABLE 2-continued

```
(pins
  (instterm-id term-id startindex endindex
  (conn
   (conn-id startindex endindex net-id net-startindex net-
endindex)
   )
  )
 )
 )
 )  /* end instances */
(occurrence
  (
    (additions
      (cells)
      (nets)
      (instances
        (params)
        (pins)
      )
    )
    (deletions
      (cells)
      (nets)
      (instances
        (params)
        (pins)
      )
    )
  )
 )
 )
```

Note: Having occurrence-based connectivity will have issues with HDL net-listing, so, preferably the front end tool forces the user to save occurence changes as a new design.

Schema Updation

Design Entry

The present invention includes facilities for schema updates at design entry, when adding components, layout, and property components. For design entry, changes if made on an id that is generated by the tool itself (determined by prefix) are preferably written to the main connectivity section. Otherwise, the changes would be written to the occurrence deletion/addition section.

When adding a new component, the new component is mapped to a new id in the connectivity net list being imported in layout. In one embodiment, the new id is a new cell-id.

Adding a new pin net connection on an existing net is identified by a new conn-id in the connectivity net list. Adding a new pin net connection on a new net is identified by new id in a net section, and a new conn-id in connectivity net list.

For modifications and/or replacements of existing components, no changes are made in the instance-id. However, a different cell id is assigned for the instance modified.

When a component is deleted, the corresponding inst-id is removed from the net list. The cell-id is removed from the net list if there are no other instances of the cell. When deleting a pin net connection, the conn-id is removed. Alternatively, corresponding changes may be implemented in startindex/endindex and/or new conn-id's are assigned.

When modifying the connectivity for a pin, one or more new conn-id(s) are created. Old conn-ids will be deleted or it's startindex/endindex is modified. e.g. A<3..0> is connected to BUS<3..0>. But, as modified, A<1> is connected to FOO<1> instead of BUS<1>.

Layout

Layout changes are written to the occurrence section. New ids corresponding to layout changes are created using the tool prefix.

When adding a new component, the location of the new component in the hierarchy is decided based on the connectivity of the pins of the component. If the component is unconnected then it is saved at the root level in the occurrence section. If the layout tool detects that the nets connected to the component are at different levels of hierarchy, a warning message is displayed to the user, such as "Change cannot be mapped to design hierarchy in schematic".

To delete a component, the component deleted is identified by writing in a deletion sub-section of occurrence. To delete a pin net connection, the conn-id of the deleted connection is written in the deletion sub-section of occurrence.

When adding a pin net connection for an existing net, if the pin is at root level, then net should also be at root level, else a warning is displayed. If the added pin is at leaf level then the present invention verifies the net or it's alias exists at that level, and a new conn-id is generated.

When adding a pin net connection for a new net and existing pin, a new net is created at the same level as the pin. If multiple pins are connected to the net, then the net id should be pointed to lowest level of hierarchy. A new net-id and new conn-id are generated. Function swaps, pin swaps, and reference designator swaps are preferably managed as property updates.

Property Updates

Property updates include function swaps, Pin swaps and other changes. For example, function swapping maps to property changes in terms of pin numbers and reference designator if across components. Pin swap are also property changes (for pin numbers, swapping pin numbers). Similarly, reference (ref) designator swaps can also be performed. Other property changes are controlled by locking.

Handling Terminations

Terminations need special handling in the flow. Both the front and back end tools should understand terminations and treat the termination as one entity. In one embodiment, termination handling is implemented in a macro. For a front end, a termination is like a hierarchical block. For example, a sample series termination macro is provided in Table 3:

TABLE 3

```
(macro series_termination
  (params
    (value ?)
    (in_netname ?)
    (out_netname ?)
    (pinid ?)   /* id of pin to which to be attached */
  )
  (cells
    (  CCell1 resistor discrete
      (terms
        (Cterm1 A 0 0 2)
        (Cterm2 B 0 0 2)
      )
    )
  )
  (nets
    (CNet1 param:in_netname 0 0 0
     - (alias)
    )
    (CNet2 param:out_netname 0 0 0)
      (alias)
    )
  )
  (instances
    (CInst1 CCell1
      (pins
        (CinstTerm1 Cterm1 0 0(conn (Cconn1 0 0
CNet1 0 0))
        (CinstTerm2 Cterm2 0 0(conn (CConn2 0 0
```

TABLE 3-continued

```
CNet2 0 0))
       )
     )
   )
 )
```

When a termination is applied in layout or design entry, it is added as a cell in the connectivity schema, for example, as shown in Table 4.

TABLE 4

```
(cell
  (CCell1 series_termination libname)
    (Params
    (value ?)
    (in_netname ?)
    (out_netname ?)
    (pinid ?)
    )
  (Instances
    (CI1 CC1
      (Params (value 5K) (in_netname ADDR<0>)(out_netname
TMP1)(pinid CNet1))
```

The schematic entry tool determines if the macro can be placed in (mapped to) the schematic. Generally, if it is mappable, it can be placed in the schematic. If the macro can be mapped, the user is prompted to determine it should be back annotated. In case the user says no or the macro is not mappable, the design entry tool tags the graphics database that no back annotation is performed. In this case, a special visible tag is preferably attached to the pin-net combination in the schematic. This special visible tag has a context sensitive menu, which shows the macro parameters, allows copy of the macro and support launching of SigXp on the termination. Signal Explorer (sigXP) provides high-speed PCB interconnect exploration and Signal Integrity (SI) analysis if it is back annotated, the added objects are treated as a single entity. If it cannot be back annotated, a special visible tag is attached on the pin to which it is to be attached. The pin to which it is to be attached is a parameter to the macro.

In describing preferred embodiments of the present invention illustrated in the drawings, specific terminology is employed for the sake of clarity. However, the present invention is not intended to be limited to the specific terminology so selected, and it is to be understood that each specific element includes all technical equivalents which operate in a similar manner. For example, when describing a change acceptance/rejection process having accept and reject checkboxes, any other equivalent device, such as a pull down selection list (in any of an Internet based acceptance process, tool or other application based UI, etc), email list of accepted changes, or any other device having an equivalent function or capability, whether or not listed herein, may be substituted therewith. Furthermore, the inventors recognize that newly developed technologies not now known may also be substituted for the described parts and still not depart from the scope of the present invention.

Portions of the present invention may be conveniently implemented using a conventional general purpose or a specialized digital computer or microprocessor programmed according to the teachings of the present disclosure, as will be apparent to those skilled in the computer art.

Appropriate software coding can readily be prepared by skilled programmers based on the teachings of the present disclosure, as will be apparent to those skilled in the software art. The invention may also be implemented by the preparation of application specific integrated circuits or by interconnecting an appropriate network of conventional component circuits, as will be readily apparent to those skilled in the art based on the present disclosure.

The present invention includes a computer program product which is a storage medium (media) having instructions stored thereon/in which can be used to control, or cause, a computer to perform any of the processes of the present invention. The storage medium can include, but is not limited to, any type of disk including floppy disks, mini disks (MD's), optical discs, DVD, CD-ROMS, micro-drive, and magneto-optical disks, ROMs, RAMs, EPROMs, EEPROMs, DRAMs, VRAMs, flash memory devices (including flash cards), magnetic or optical cards, nanosystems (including molecular memory ICs), RAID devices, remote data storage/archive/warehousing, or any type of media or device suitable for storing instructions and/or data.

Stored on any one of the computer readable medium (media), the present invention includes software for controlling both the hardware of the general purpose/specialized computer or microprocessor, and for enabling the computer or microprocessor to interact with a human user or other mechanism utilizing the results of the present invention. Such software may include, but is not limited to, device drivers, operating systems, and user applications. Data used by the software may be retrieved from different sources (local or remote) and either permanently or temporarily stored (before, during, or after any processing) by utilizing any of text files, delimited files, database(s), or other storage techniques. Ultimately, such computer readable media further includes software for performing the present invention, as described above.

Included in the programming (software) of the general/specialized computer or microprocessor are software modules for implementing the teachings of the present invention, including, but not limited to, storing design changes, sorting/displaying changes, accepting/rejecting changes, synchronizing changes, adding changes to a design, presenting user warnings when changes are unacceptable (e.g., unable to be mapped), identifying connectivities, handling terminations, saving designs, importing designs, and the display, storage, or communication of results according to the processes of the present invention.

Obviously, numerous modifications and variations of the present invention are possible in light of the above teachings. It is therefore to be understood that within the scope of the appended claims, the invention may be practiced otherwise than as specifically described herein.

What is claimed is:

1. A method of concurrent engineering, comprising the steps of:

establishing a baseline electronic design;

sending copies of the baseline electronic design to different design groups;

modifying more than one of the baseline electronic designs sent to the design groups with engineering changes; and synchronizing the modified baselined electronic designs to produce a synchronized design;

wherein:

said synchronization comprises at least one of, determining if new Id is present in a design connectivity database DESCONN and not present in a layout connectivity database LAYCONN, and then processing a new object corresponding to the new Id added by a front end design tool, determining if a front end design tool created Id is present in LAYCONN and not present in DESCONN, and then processing an object deleted by the front end design tool, determining if a front end Id is present in each of LAYCONN, DESCONN, and in an occurrence delete section of LAYCONN, and then processing an object deleted by a layout tool, determining if a layout Id is present in an occurrence add section of LAYCONN, and then processing a new object added by the layout tool, determining if a layout id is present in an occurrence delete section of DESCONN and in the occurrence add section of LAYCONN, and then processing the Id added by the layout tool and then deleted by the front end tool, determining is a same instance id but different cell id is present in DESCONN, and then processing a modify/replace performed by the front end design tool, and determining each of a new pin net connection id in LAYCONN, a corresponding pin net connection id in the occurrence section of LAYCONN, a new pin net connection id in DESCONN corresponding to the pin net connection id in the occurrence section of LAYCONN, and then processing a simultaneous change of connectivity to a pin by the front end design tool and a back end design tool.

2. The method according to claim 1, wherein said step of synchronizing comprises the steps of:

listing each of the design changes made by the design groups;

selecting listed design changes for acceptance or rejection; and merging the selected design changes for acceptance into the synchronized design.

3. The method according to claim 2, wherein said step of listing, further comprises, for each design change, displaying a user interface with an input for accepting at least one of the design changes.

4. The method according to claim 2, wherein said step of merging includes creating a new net at a same level as an existing pin when the selected design changes include the addition of a pin net connection for added net and the existing pin.

5. The method according to claim 1, wherein said different design groups comprise engineering groups, each group utilizing a different design tool having different types of electronic design functionality for changes to the baseline electronic design, and the changes are made at different stages of electronic design development including design entry, connectivity and placement.

6. The method according to claim 1, wherein said step of synchronizing includes synchronizing changes in both front end design tools and back end design tools from the different design groups comprising, updates made by an owner user made in the baseline electronic design, and updates made by a non-owner user made in a non-owner user's copy of the baseline electronic design comprising annotations of the non-owner user's updates.

7. The method according to claim 6, wherein said method is embodied in a set of computer readable instructions stored in an electronic signal.

8. The method according to claim 1, further comprising the step of tracking only non owner changes in the modified designs.

9. The method according to claim 8, wherein said step of synchronizing comprises synchronizing non owner changes with the owner's copy of the baseline design.

10. The method according to claim 9, wherein said step of tracking changes comprises placing non-owner changes in a section of a design database corresponding to the non-owner making the change.

11. The method according to claim 8, wherein said step of tracking further comprises making owner changes and tracking non-owner changes.

12. The method according to claim 1, wherein one of said groups includes an owner of the design.

13. The method according to claim 1, wherein said step of synchronizing is performed without reading the baseline design.

14. The method according to claim 1, wherein said step of synchronizing comprises determining, without using the baseline design, whether an owner or other user made the design changes.

15. The method according to claim 14, wherein said step of viewing changes comprises logging in to a web site that displays the design changes and retrieves a user input indicating at least one of acceptance and rejection of the design changes.

16. The method according to claim 1, wherein said step of synchronizing comprises viewing changes proposed by each of the design groups, and approving or rejecting at least one of the design changes.

17. The method according to claim 1, further comprising the steps of:
re-distributing the synchronized design to a second set of design groups;
making design changes by the second set of design groups; and
synchronizing the design changes made by the second set of design groups.

18. The method according to claim 1, wherein:
said method is embodied in a set of computer instructions stored on a computer readable media;
said computer instructions, when loaded into a computer, cause the computer to perform the steps of said method.

19. The method according to claim 18, wherein said computer instruction are compiled computer instructions stored as an executable program on said computer readable media.

20. The method according to claim 1, wherein the design groups include,
an owner-user that makes updates in the baseline electronic design, and
non-owner users that makes updates in a non-owner user's copy of the baseline electronic design including a separate section that annotates each change in the design.

21. The method according to claim 20, wherein the synchronization device deduces whether a design element was added or deleted from an original baseline design without use of the original baseline design by comparing the designated users design to a non-designated users design and the annotation section of the non-designated user's design.

22. The method according to claim 1 wherein the step of synchronizing comprises sorting changes in the modified baseline designs according to electronic design tools utilized for making the changes and then synchronizing the changes in the sorted order.

23. A device, comprising:
means for synchronizing multiple designs each modified from a baseline;
each of said multiple designs comprises a design connectivity database storing design components and connectivity of a design and modifications made by design or front end tools (DESCONN), a layout connectivity database storing layout data and modifications of the design made by layout or backend tools (LAYCONN);
the design connectivity and layout connectivity databases include occurrence sections to identify changes made from a baseline of the designs;
said means for synchronizing comprises comparison means for comparing identifiers contained in the databases and sections of the databases related to added, deleted, and modified components and connectivity of the design, and processing means for merging the changes from the different designs,
wherein said processing means includes means for:
determining if new Id is present in a design connectivity database DESCONN and not present in a layout connectivity database LAYCONN, and then processing a new object corresponding to the new Id added by a front end design tool,
determining if a front end design tool created Id is present in LAYCONN and not present in DESCONN, and then processing an object deleted by the front end design tool,
determining if a front end Id is present in each of LAYCONN, DESCONN, and in an occurrence delete section of LAYCONN, and then processing an object deleted by a layout tool,
determining if a layout Id is present in an occurrence add section of LAYCONN, and then processing a new object added by the layout tool,
determining if a layout id is present in an occurrence delete section of DESCONN and in the occurrence add section of LAYCONN, and then processing the Id added by the layout tool and then deleted by the front end tool,
determining is a same instance id but different cell id is present in DESCONN, and then processing a modify/replace performed by the front end design tool, and
determining each of a new pin net connection id in LAYCONN, a corresponding pin net connection id in the occurrence section of LAYCONN, a new pin net connection id in DESCONN corresponding to the pin net connection id in the occurrence section of LAYCONN and then processing a simultaneous change of connectivity to a pin by the front end design tool and a back end design tool.

24. The device according to claim 23, wherein said occurrence sections track all non-designated changes to the design.

25. The device according to claim 24, wherein said non-designated changes are non-owner changes to the designs.

26. The device according to claim 23, wherein said databases track a user change history for only non-owner changes.

27. The device according to claim 23, wherein said synchronization means performs said synchronization without direct reference to the baseline design.

* * * * *